(12) United States Patent
Miwata et al.

(10) Patent No.: US 11,369,038 B2
(45) Date of Patent: Jun. 21, 2022

(54) LIGHT IRRADIATION DEVICE

(71) Applicant: Ushio Denki Kabushiki Kaisha, Tokyo (JP)

(72) Inventors: Shuhei Miwata, Tokyo (JP); Yusuke Miyauchi, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 329 days.

(21) Appl. No.: 16/824,516

(22) Filed: Mar. 19, 2020

(65) Prior Publication Data

US 2020/0298600 A1   Sep. 24, 2020

(30) Foreign Application Priority Data

Mar. 22, 2019   (JP) .............................. JP2019-054284

(51) Int. Cl.
*H05K 7/20* (2006.01)
*B41J 29/377* (2006.01)
*B41J 11/00* (2006.01)

(52) U.S. Cl.
CPC .... *H05K 7/20163* (2013.01); *B41J 11/00214* (2021.01); *B41J 11/00218* (2021.01); *B41J 29/377* (2013.01); *H05K 7/20145* (2013.01); *H05K 7/20154* (2013.01)

(58) Field of Classification Search
CPC ........... H05K 7/20163; H05K 7/20145; H05K 7/20154; B41J 11/00214; B41J 11/00218; B41J 29/377; B41J 11/0021
See application file for complete search history.

(56) References Cited

U.S. PATENT DOCUMENTS

| 2011/0181842 | A1 | 7/2011 | Kanno et al. |
| 2016/0016337 | A1 | 1/2016 | Kobayashi |
| 2020/0205313 | A1* | 6/2020 | Watanabe .......... H05K 7/20163 |

FOREIGN PATENT DOCUMENTS

| JP | 2011-154855 A | 8/2011 |
| JP | 2016-024917 A | 2/2016 |

* cited by examiner

*Primary Examiner* — Bradley W Thies
(74) *Attorney, Agent, or Firm* — Studebaker & Brackett PC

(57) ABSTRACT

The light irradiation device includes a housing an air inlet through which cooling wind is introduced into the housing, an air outlet through which the cooling wind is discharged, a wind flow path through which the cooling wind taken in through the air inlet into the housing flows toward the air outlet, a light source part configured to be able to emit light toward the outside of the housing, and a heat sink provided at a position opposite to the first surface based on the light source part, in the wind flow path, wherein the wind flow path includes a first wind flow region and a second wind flow region located closer to the air outlet than the first wind flow region and having a smaller flow path cross sectional area than the first wind flow region.

11 Claims, 6 Drawing Sheets

LIGHT IRRADIATION DEVICE

BACKGROUND OF THE INVENTION

Field of the Invention

The present invention relates to a light irradiation device, particularly relates to a light irradiation device that irradiates light with an LED element.

Description of the Related Art

A printer (hereinafter, sometimes referred to as a "UV printer") is known which performs printing using a photo-curable ink that is cured by irradiation with ultraviolet light. Discharge lamps have heretofore been used as light sources for UV printers. However, in recent years, LED elements have come to be used instead of discharge lamps because LED elements have advantages such as low energy consumption and long lifetime. However, an LED element has low output power when used alone, and therefore a plurality of LED elements need to be arranged as a light source to achieve the amount of ultraviolet light required for curing ink in a short period of time.

When a plurality of LED elements are arranged as a light source, heat is generated on the light source side, which causes a problem. The luminous efficacy and lifetime of an LED element reduce as the operating temperature increases, and therefore high heat rejection performance needs to be achieved from the viewpoint of improving efficiency and lifetime characteristics.

One of systems that reject heat generated by LED elements is a system that has a heat sink through which cooling wind flows to absorb and reject heat. For example, the following Patent Document 1 discloses a structure of a light source device for use in a projection-type image display device, in which the flow of cooling wind is generated using a fan along a direction, in which LED elements are arranged, for a radiator thermally connected to the LED elements to reject the heat of the LED elements.

PRIOR ART DOCUMENTS

Patent Documents

Patent Document 1: JP-A-2011-154855
Patent Document 2: JP-A-2016-24917

SUMMARY OF THE INVENTION

LED elements have the property that the intensity of emitted light reduces as the temperature increases. Therefore, when a large temperature difference occurs in a light source part of a light source device using a plurality of LED elements, variations occur in the intensity of emitted light.

However, a light source device for use in a UV printer is expected to irradiate light of uniform intensity to a printing surface to prevent UV ink from being unevenly cured. Therefore, it is preferred that a cooling system is provided to reduce a temperature difference in the entire region where LED elements are arranged.

There is also an idea that no cooling mechanism is provided. However, when a system for cooling LED elements is not provided in a light source device using LED elements, in many cases, there is a fear that the temperature of the LED elements excessively increases so that the LED elements cannot emit light at a predetermined driving current and are therefore turned off. Therefore, some kind of cooling system needs to be provided to prevent the LED elements from being turned off due to temperature increase.

As described above, Patent Document 1 discloses a cooling system that allows cooling air to flow in one direction along a direction in which LED elements are arranged. However, in the case of the system disclosed in Patent Document 1, there is a large difference in the amount of heat that air can absorb between the upstream part where air that has just been taken in flows and the downstream part where high-temperature air that has absorbed heat in the upstream part flows, which causes a difference in temperature among the LED elements. That is, the intensity of light irradiated from the light source device varies depending on the position of the LED arranged in the light source device.

Patent Document 2 discloses a structure of a light source device capable of reducing a temperature difference caused by a difference in the position of an LED arranged therein to irradiate light at an almost uniform irradiation intensity. The structure disclosed in Patent Document 2 includes a wind tunnel in which cooling air taken in through two side surfaces is allowed to flow through heat radiation fins while being turned back at the center, and to be discharged through the same side surfaces.

However, even in the case of the above structure disclosed in Patent Document 2, there is a temperature difference between the center located in the upstream part of the wind tunnel where cooling air flows and the end located in the downstream part of the wind tunnel. Further, the light source device increases in size when an air inlet and an air outlet are provided in each of the two side surfaces. Further, when cooling fans are provided for all the air inlets and air outlets, the number of members increases so that production costs increase.

Alternatively, a heat sink having higher heat rejection performance may be used. However, commercially-available heat sinks have predetermined sizes and shapes depending on their intended use, and therefore production of heat sinks having desired sizes and shapes increases costs. Further, when a large heat sink is used to enhance heat rejection performance, the entire size of the device increases.

In light of the above problems, it is an object of the present invention to provide a light irradiation device having a simple structure and capable of irradiating light of uniform intensity without increasing the entire size thereof.

The present invention is directed to a light irradiation device including:
a housing;
an air inlet through which cooling wind for cooling is introduced into the housing;
an air outlet through which the cooling wind is discharged to outside of the housing;
a wind flow path through which the cooling wind taken in through the air inlet into the housing flows toward the air outlet;
a light source part configured to be able to emit light toward the outside of the housing via a first surface that is one side surface of the housing, the light source part including a plurality of LED elements arranged along the first surface in a region of the housing located on a first surface side of the housing; and
a heat sink provided at a position opposite to the first surface based on the light source part, in the wind flow path,
wherein the wind flow path includes
a first wind flow region and a second wind flow region located closer to the air outlet than the first wind flow region and having a smaller flow path cross sectional area than the first wind flow region.

The second wind flow region is provided closer to the air outlet than the first wind flow region. That is, cooling wind flowing through the second wind flow region has a higher temperature than cooling wind flowing through the first wind flow region because it has absorbed not a little heat in the first wind flow region.

Further, the second wind flow region is configured to have a smaller flow path cross sectional area than the first wind flow region. That is, cooling wind flowing through the second wind flow region has a higher flow rate than cooling wind flowing through the first wind flow region according to Bernoulli's theory. Due to the above-described structure, although cooling wind flowing through the second wind flow region has a higher temperature than cooling wind flowing through the first wind flow region, the flow rate of cooling wind flowing through the second wind flow region is higher than that of cooling wind flowing through the first wind flow region.

Here, the flow path cross sectional area refers to the cross sectional area of the wind flow path cut along the surface orthogonal to a direction from the air inlet to the air outlet. Specific examples of the structure of the second wind flow region include a structure in which the height of the wind flow path from the first surface is smaller than that of the first wind flow region and a structure in which the width of the wind flow path is smaller only in a region where the heat sink is not provided in the wind flow path.

The heat sink can reject more heat by flowing the high-speed cooling wind. That is, the above-described structure makes the flow rate of cooling wind higher in the second wind flow region, which is a downstream part of the wind flow path where heat is less likely to be absorbed by cooling wind, than in the first wind flow region, and therefore the heat sink can reject more heat in the downstream part. Therefore, the light irradiation device is capable of reducing a temperature difference in the entire light source part and emitting light having improved uniformity of light intensity.

In the light irradiation device,
the heat sink may be provided across the first wind flow region and the second wind flow region.

In order to improve the uniformity of light intensity of the entire light source part, the heat sink is preferably provided across the first wind flow region and the second wind flow region. It is to be noted that the heat sink may be provided on the opposite side from the light source part in the direction of light emission, or may include a plurality of heat sinks provided in an array in the region of the light source part.

In the light irradiation device,
the second wind flow region may be configured so that a length thereof in a direction from the air inlet to the air outlet is larger than that of the first wind flow region.

When heat is rejected from the heat sink by cooling wind, the temperature of the cooling wind hitting the heat sink is low near the air inlet through which the cooling wind is taken in, and therefore the cooling wind can absorb much heat from the heat sink so that the temperature of the heat sink is easily reduced.

However, the cooling wind that has absorbed much heat near the air inlet has a small amount of heat that can absorb heat except the air inlet, and therefore the temperature of the light source part is distributed so as to increase toward the air outlet. Further, the cooling wind absorbs much heat only near the air inlet, and therefore cannot absorb much heat except a region near the air inlet. Therefore, the light source part tends to have a temperature distribution in which only the temperature near the air inlet is low.

Therefore, when the second wind flow region, in which the heat rejection efficiency is improved by increasing the velocity of the cooling wind, the length thereof in a direction from the air inlet to the air outlet is longer than that of the first wind flow region is configured, the heat rejection efficiency of the entire heat sink is adjusted, and the uniformity of temperature distribution of the entire light source part is further improved.

As described above, in the direction in which cooling wind flows through the wind flow path from the air inlet toward the air outlet, the distance at which the cooling wind can flow in a state where it can sufficiently absorb heat is shorter than the distance at which the cooling wind flows in a state where it has a high temperature and is less likely to absorb heat from the heat sink. Therefore, the second wind flow region in which the flow rate of the cooling wind is increased to enhance heat rejection efficiency is preferably configured to be longer than the first wind flow region.

It is to be noted that the heat rejection efficiency of the heat sink in the entire flow path is adjusted, and the uniformity of temperature distribution of the entire light source part is further improved by appropriately adjusting the distance of the first wind flow region and the distance of the second wind flow region in a direction from the air inlet to the air outlet depending on the size etc. of the housing or the heat sink.

The light irradiation device may include
a wind shielding member provided in the wind flow path and having at least two surfaces,
the wind shielding member including
a wind shielding surface that shields part of the cooling wind that has flowed through the first wind flow region toward the second wind flow region, and
a wind guiding surface connected to the wind shielding surface, extending along the first surface, and located closer to the air outlet than the wind shielding surface in a direction in which the wind shielding surface extends,
wherein the second wind flow region is a region closer to the first surface than the wind guiding surface, and
the first wind flow region is longer than the second wind flow region in a direction orthogonal to the first surface.

The first wind flow region and the second wind flow region may be formed by shaping the housing. However, in most cases, the housing is rectangular parallelepiped or cubic in terms of processing cost and usability, and therefore the wind flow path provided in the housing is also rectangular parallelepiped or cubic. Therefore, the above-described structure makes it possible to simply provide a first wind flow region and a second wind flow region having a smaller flow path cross sectional area than the first wind flow region irrespective of the shape of the housing. It is to be noted that the second wind flow region may be constituted from a plurality of wind shielding members.

The first wind flow region may be configured to have a region whose flow path cross sectional area gradually decreases as getting close to the second wind flow region.

When the first wind flow region is configured to have a region whose flow path sectional area gradually decreases as getting close to the second wind flow region, the flow rate of the cooling wind flowing through the first wind flow region can gradually be increased, and the cooling wind is allowed to smoothly flow toward the second wind flow region (downstream part). Further, by adjusting the distance or shape of the region whose flow path sectional area gradually decreases, the heat rejection efficiency of the heat sink in the entire wind flow path can more finely be adjusted depending on position, and therefore the uniformity of temperature distribution of the entire light source part is further improved.

The housing may include, in a side surface having the air outlet, a blower for discharging the cooling wind to the outside of the housing.

When the housing includes a blower in a side surface having the air inlet, there is a possibility that part of the cooling wind that has absorbed heat from the heat sink accumulates in, for example, a space created by providing the second wind flow region and is not discharged through the air outlet. The housing may include a fan for blower in the side surface having the air outlet, thereby guiding cooling wind in the hosing to the air outlet to successively discharge the cooling wind that has absorbed heat from the heat sink through the air outlet. Therefore, it is possible to efficiently take in cooling wind through the air inlet, allow the cooling wind to flow through the wind flow path, and discharge the cooling wind through the air outlet.

According to the present invention, it is possible to achieve a light irradiation device having a simple structure and capable of irradiating light of uniform intensity without increasing the entire size thereof.

DETAILED DESCRIPTION OF THE PREFERRED EMBODIMENTS

Hereinbelow, a light irradiation device according to the present invention will be described with reference to the drawings. It is to be noted that all the drawings are schematically shown, and the size ratio between components and the number of components in each of the drawings are not always the same as the actual size ratio and number.

Figure 1:
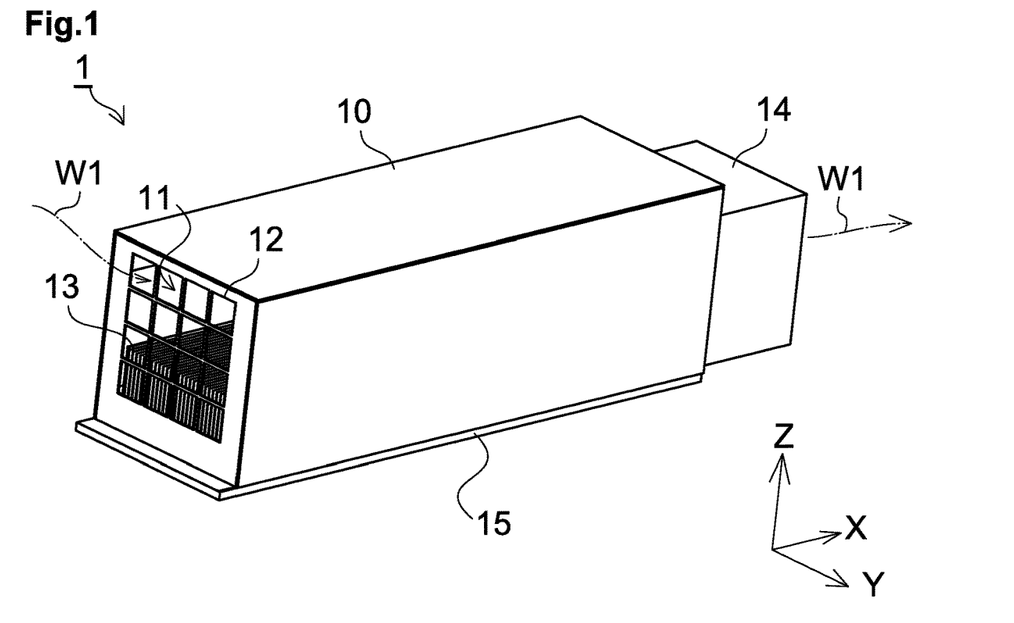
FIG. 1 is an overall perspective view schematically showing an embodiment of a light irradiation device.
Figure 2:
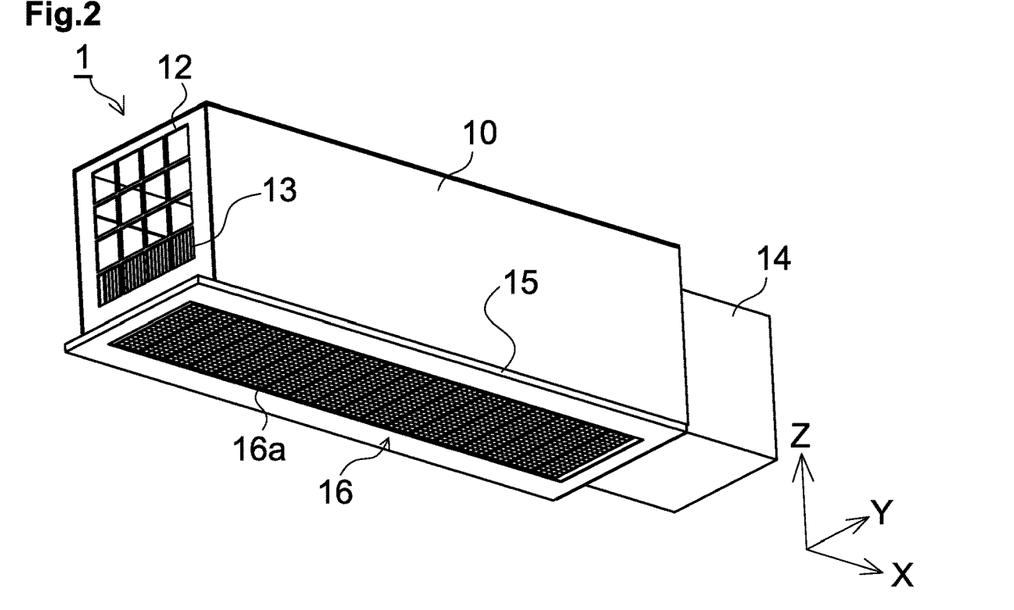
FIG. 2 is an overall perspective view schematically showing the embodiment of the light irradiation device viewed in a direction different from a direction shown in FIG. 1.

FIG. 1 is a top perspective view schematically showing an embodiment of a light irradiation device 1. FIG. 2 is an overall perspective view schematically showing the embodiment of the light irradiation device 1 viewed in a direction different from a direction shown in FIG. 1. As shown in FIG. 1 and FIG. 2, the light irradiation device 1 according to this embodiment includes a rectangular tubular housing 10, a wind flow path 11, an air inlet 12, a heat sink 13, a blower 14, a light source part 16, and an outlet 17 (see FIG. 3 described later).

The air inlet 12 is provided in one side surface of the housing 10, and has the function of taking in cooling wind W1 into the housing 10. In the housing 10, the wind flow path 11 is provided to allow the cooling wind W1 taken in from the air inlet 12 flows.

The heat sink 13 is provided in the housing 10 as part of the wind flow path 11. More specifically, the heat sink 13 is provided at a position opposite to a side surface 15 of the housing 10 based on the light source part 16, and so as to be thermally connected to the light source part 16 (hereinafter, also referred to as a "first surface 15"). The blower 14 is provided in a surface of the housing 10 opposite to the side surface having the air inlet 12.

As shown in FIG. 2, the light source part 16 is provided by arranging a plurality of LED elements 16a along the first surface 15 in a region of the housing 10 so that light can be emitted toward the outside of the housing 10.

Here, in the description of this embodiment, a direction from the air inlet 12 to the blower 14 is defined as an X direction, and a plane orthogonal to the X direction is defined as a YZ plane. Further, a plane parallel to the first surface 15 of the housing 10 having the heat sink 13 is defined as an XY plane.

Figure 3:
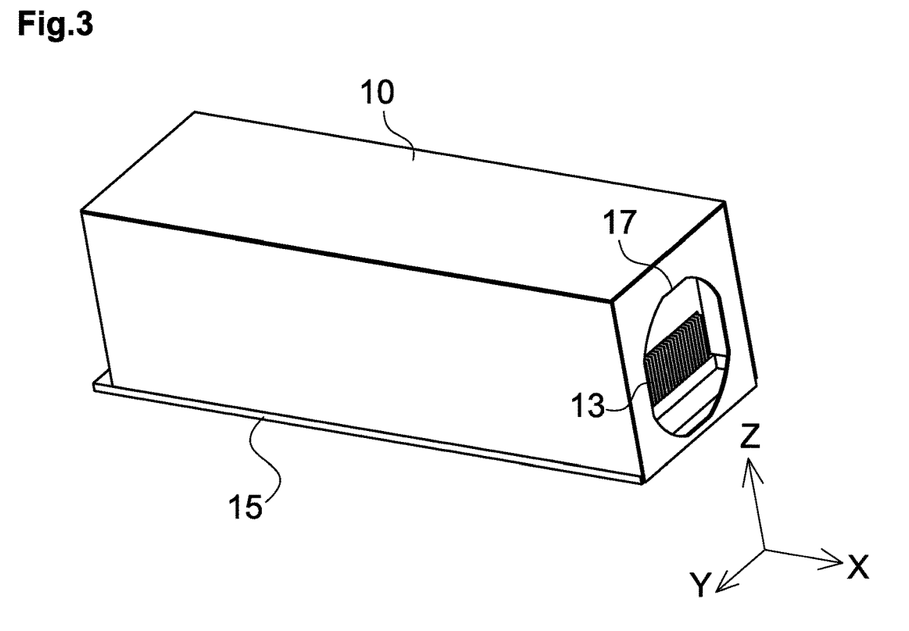
FIG. 3 is an overall perspective view schematically showing the embodiment of the light irradiation device viewed in a direction different from a direction shown in FIG. 1 in a state where a blower is taken off.

FIG. 3 is an overall perspective view schematically showing the embodiment of the light irradiation device 1 viewed in a direction different from a direction shown in FIG. 1 in a state where the blower 14 is taken off. As shown in FIG. 3, the air outlet 17 is provided in a surface that is opposite to the air inlet 12 and has the blower 14 shown in FIG. 1.

Figure 4:
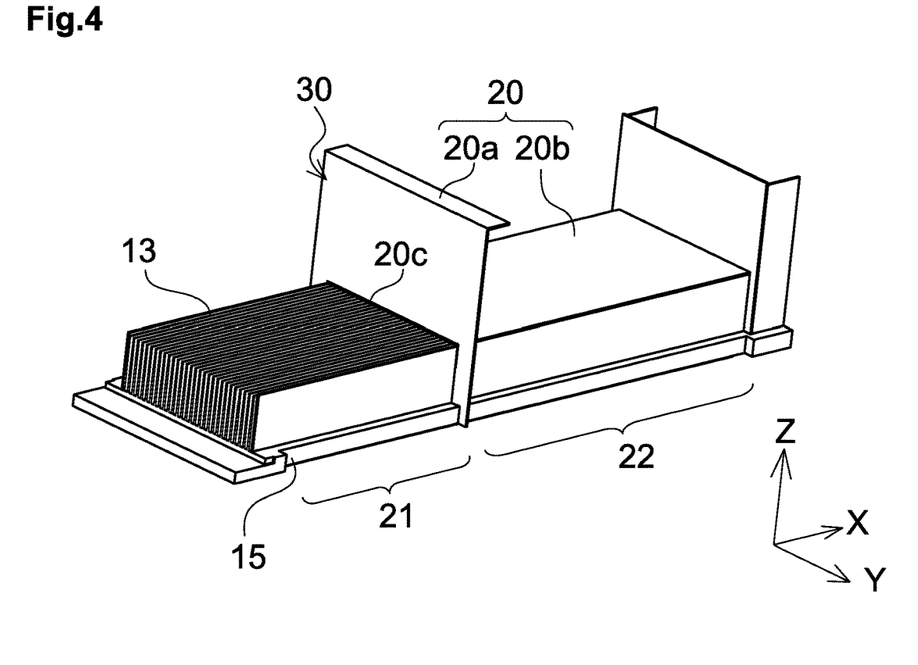
FIG. 4 is an overall perspective view schematically showing the embodiment of the light irradiation device viewed in the same direction as shown in FIG. 1 in a state where a housing and a blower are taken off.
Figure 5:
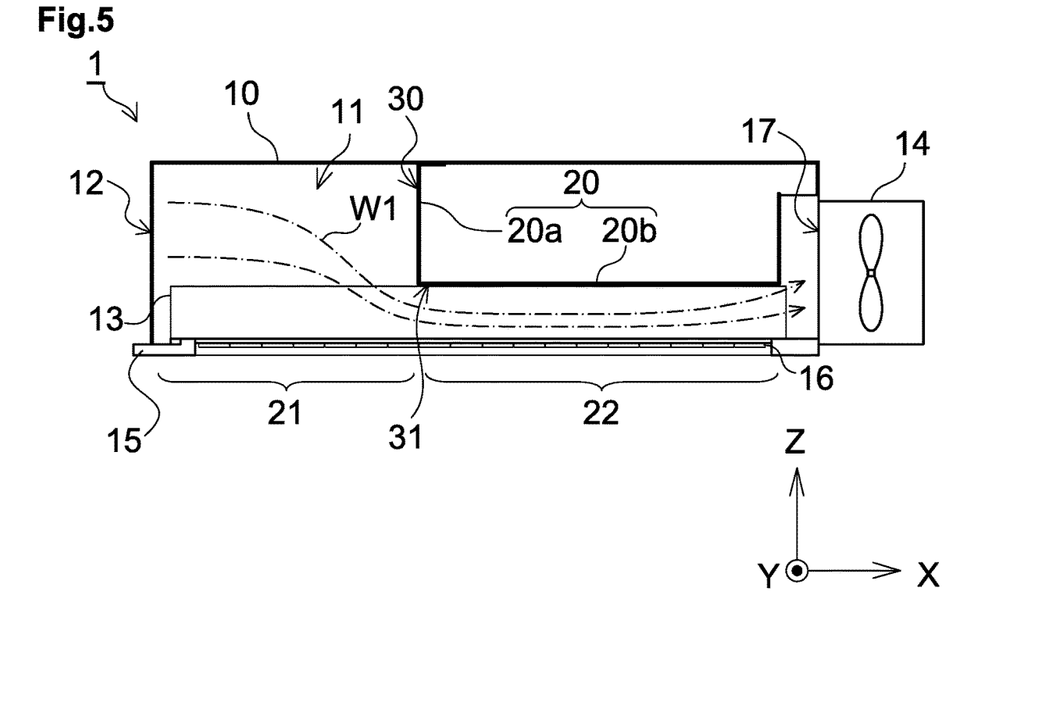
FIG. 5 is a schematic sectional view of the XZ plane of the light irradiation device shown in FIG. 1.
Figure 6:
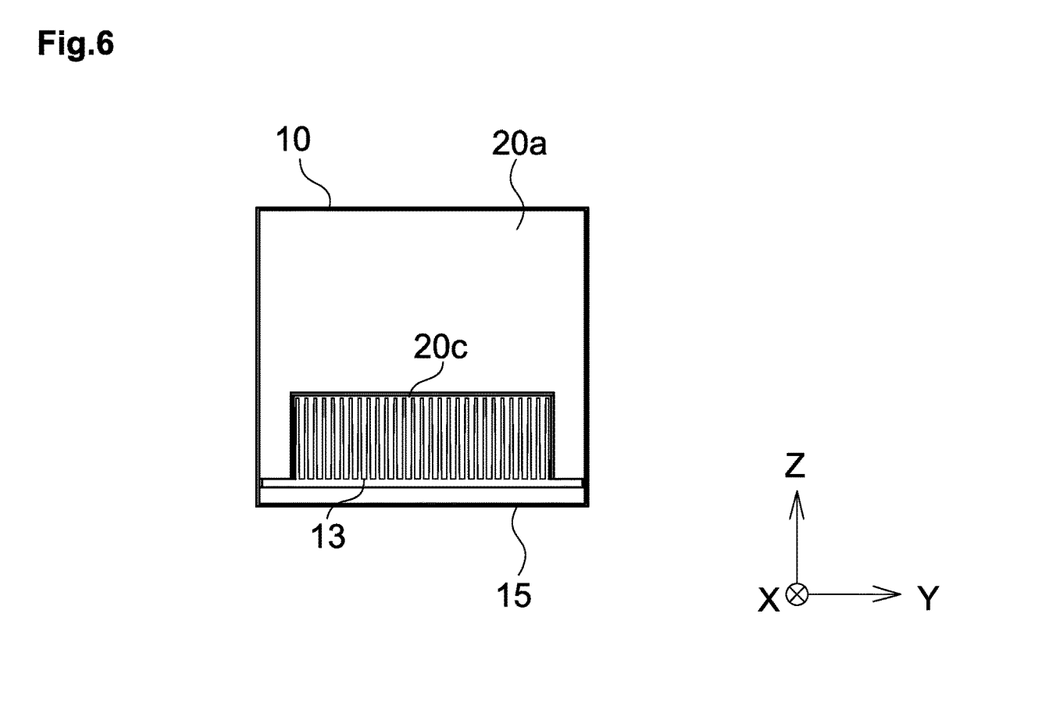
FIG. 6 is a schematic sectional view of the YZ plane of the light irradiation device shown in FIG. 1.

FIG. 4 is an overall perspective view schematically showing the embodiment of the light irradiation device 1 viewed in the same direction as shown in FIG. 1 in a state where the housing 10 and the blower 14 are taken off. In the housing 10 of the light irradiation device 1, the heat sink 13 is provided over the entire first surface 15, and a wind shielding member 20 is provided so as to cover part of the heat sink 13. It is to be noted that FIG. 5 is a schematic sectional view of the XZ plane of the light irradiation device 1 shown in FIG. 1, and FIG. 6 is a schematic sectional view of the YZ plane of the light irradiation device 1 shown in FIG. 1. Hereinbelow, a description will be made with reference to FIGS. 4 to 6.

As shown in FIGS. 4 to 6, the wind shielding member 20 includes a wind shielding plate 20a and a cover member 20b. The cover member 20b is provided downstream from the wind shielding plate 20a (on the air outlet 17 side) to decrease the flow path cross sectional area of the wind flow path 11.

The wind shielding plate 20a constituting part of the wind shielding member 20 includes a vent 20c provided as an open region, and constitutes a wind shielding surface 30 provided on the YZ plane and having the function of shielding the cooling wind W1 traveling in the +X direction in a region other than the vent 20c provided close to the first surface 15. Part of the cooling wind W1 taken in through the air inlet 12 into the housing 10 flows in a region far from the first surface 15 in the +Z direction, travels in the +X direction, comes into collision with the wind shielding plate 20a, and then flows near the heat sink 13 through the vent 20c provided on the first surface 15 side into the downstream side of the wind shielding plate 20a. Part of the cooling wind W1 taken in through the air inlet 12 into the housing 10 flows near the first surface 15, that is, near the heat sink 13, and directly flows into the downstream side of the wind shielding plate 20a through the vent 20c while flowing near the heat sink 13.

Hereinafter, a wind flow region provided in the wind flow path 11, through which the cooling wind W1 taken in into the housing 10 flows, and located upstream of the wind shielding plate 20a, that is, located on the air inlet 12 side is called "first wind flow region 21", and a wind flow region provided in the wind flow path 11 and located downstream of the wind shielding plate 20a, that is, located on the air outlet 17 side is called "second wind flow region 22".

The cover member 20b constituting part of the wind shielding member 20 is provided in the second wind flow region 22. The cover member 20b is provided so as to cover the +Z-side region of the heat sink 13 to constitute a wind guiding surface 31. Therefore, the second wind flow region 22 is configured to have a smaller flow path cross sectional area than the first wind flow region 21, and the heat sink 13 is provided across the first wind flow region 21 and the second wind flow region 22.

As shown in FIG. 5, the cooling wind W1 taken in through the air inlet 12 flows through the first wind flow region 21 and the second wind flow region 22 in the +X direction, and is discharged from the air outlet 17 through the blower 14. The example shown in FIG. 5 is configured so that the length of the second wind flow region 22 in the X direction is longer than that of the first wind flow region 21 in the X direction.

As described above, the cooling wind W1 flowing through the first wind flow region 21 is guided to the vent 20c provided in the wind shielding plate 20a. Then, the cooling wind W1 that has passed through the vent 20c flows through the second wind flow region 22 whose flow path cross sectional area is smaller than that of the first wind flow region 21. Therefore, the cooling wind W1 flowing through the second wind flow region 22 has a flow rate higher than that of the cooling wind W1 flowing through the first wind flow region 21 according to the Bernoulli's theory.

As described above, the cooling wind W1 flowing through the second wind flow region 22 that is a downstream part of the wind flow path 11 has a flow rate higher than that of the cooling wind W1 flowing through the first wind flow region 21, and therefore the heat rejection efficiency of the heat sink 13 in the downstream part is improved as compared with conventional structures. Therefore, the light irradiation device 1 according to this embodiment can achieve improved uniformity of heat rejection efficiency from the upstream part to the downstream part without increasing the size of the heat sink 13 and changing the shape of the heat sink 13 so that a temperature difference in the entire light source part 16 is reduced. This makes it possible to improve the uniformity of the intensity of light emitted from each LED element 16a arranged in the light source part 16 without increasing the entire size of the light irradiation device 1.

Examination 1

First, in order to confirm the effect of the above-described embodiment, simulation was performed to compare temperature distribution between a conventional structure and the above-described embodiment, and the result of the simulation is shown.

The comparison was made between a conventional structure (Comparative Example 1) in which the flow path cross sectional area of the wind flow path 11 in the X direction was constant throughout the wind flow path 11 and the light irradiation device 1 shown in FIG. 1 (Example 1).

Example 1

The length (length in the X direction) and width (length in the Y direction) of the wind flow path 11 were 330 mm and 90 mm, respectively, and the length (length in the X direction) of the second wind flow region 22 was 198 mm. Further, the height (length in the Z direction) of the heat sink 13 provided in the wind flow path 11 was 29 mm. The light source part 16 was provided by arranging the plurality of LED elements 16a in a matrix in the housing 10, and the heat sink 13 was provided in a direction opposite to the light emission direction of the light source part 16. The region where the light source part 16 was provided had an X×Y size of 325 mm×50 mm, and was located inside the region where the heat sink 13 was provided on the XY plane.

The height of the first wind flow region 21 from the first surface 15 was 95 mm, and the height of the second wind flow region 22 from the first surface 15 was 30 mm. The wind shielding plate 20a was provided on the YZ plane.

Comparative Example 1

The height of the wind flow path 11 from the first surface 15 was 95 mm. That is, Comparative Example 1 was the same as Example 1 except that neither of the first wind flow region 21 and the second wind flow region 22 were provided.

Simulation Method

The LED elements 16a constituting the light source part 16 were turned on while cooling wind W1 was taken in through the air inlet 12 at a wind speed of 7 m/s, and when the LED elements 16a reached a steady state, temperature distribution was calculated at 20 calculation points located at the center of the light source part 16 in the Y direction at even intervals in the X direction.

Result

Figure 7:
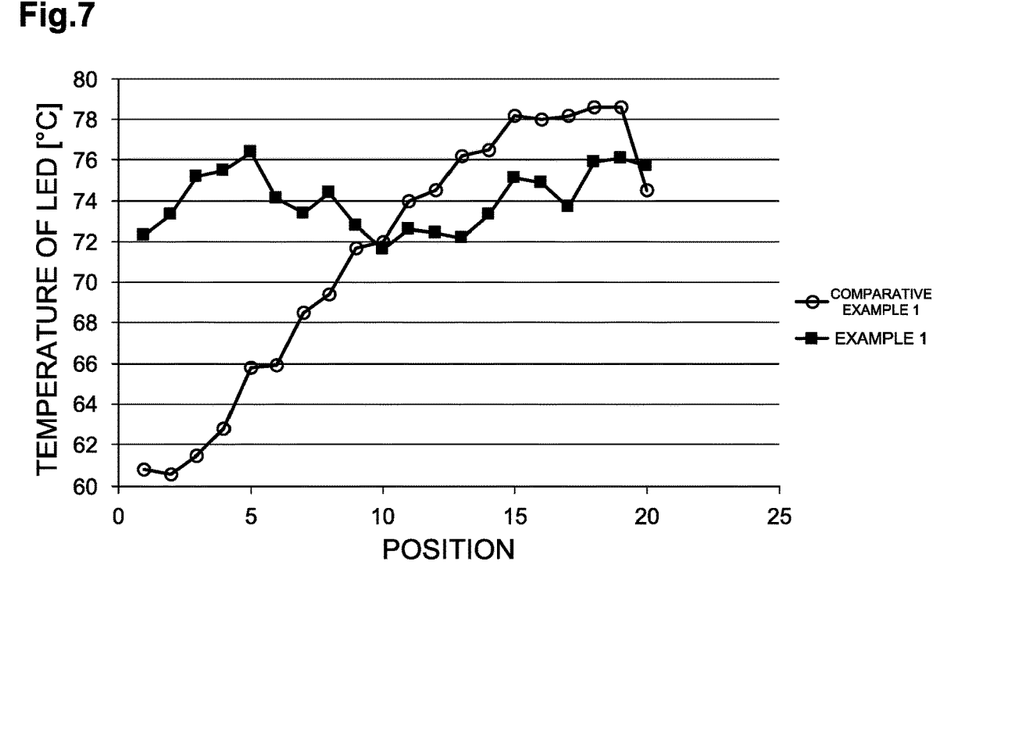
FIG. 7 is a graph showing the simulation result of Examination 1.

FIG. 7 is a graph showing the simulation result of Examination 1. FIG. 7 indicates that in the case of Comparative Example 1 (conventional structure), the temperatures of the LED elements 16a located at position 18 and position 19 were highest (78.6° C.) and the temperature of the LED element 16a located at position 2 was lowest (60.6° C.). As a result, the difference between the highest temperature and the lowest temperature was 18.0° C.

On the other hand, in the case of Example 1 (structure according to the present invention), the temperature of the LED element 16a located at position 5 was highest (76.4° C.), and the temperature of the LED element 16a located at position 10 was lowest (71.6° C.). As a result, the difference between the highest temperature and the lowest temperature was 4.8° C.

From the result, it can be confirmed that the temperature difference depending on the position of the LED element 16a of Example 1 was reduced as compared with that of Comparative Example 1. Further, it can also be confirmed that the highest temperature of Example 1 (structure according to the present invention) did not exceed the highest temperature of Comparative Example 1 (conventional structure), and the temperatures of the LED elements 16*a* did not increase to the extent that the LED elements 16*a* were turned off.

Examination 2

Then, the relationship between the lengths of the first wind flow region 21 and the second wind flow region 22 in the X direction and the temperature difference among the LED elements 16*a* located at different positions was examined.

More specifically, simulation was performed to examine how the temperature difference between the highest temperature and the lowest temperature in the entire light source part 16 was changed when the lengths of the first wind flow region 21 and the second wind flow region 22 in the X direction were changed. Simulation conditions are as follows.

Example 2

The length (length in the X direction) and width (length in the Y direction) of the wind flow path 11 were 306 mm and 90 mm, respectively, and the length (length in the X direction) of the second wind flow region 22 was 175 mm. Further, the height (length in the Z direction) of the heat sink 13 provided in the wind flow path 11 was 29 mm. The light source part 16 was provided by arranging the plurality of LED elements 16*a* in a matrix in the housing 10, and the heat sink 13 was provided in a direction opposite to the light emission direction of the light source part 16. The region where the light source part 16 was provided had an X×Y size of 325 mm×50 mm, and was located inside the region where the heat sink 13 was provided on the XY plane.

The height of the first wind flow region 21 from the first surface 15 was 95 mm, and the height of the second wind flow region 22 from the first surface 15 was 30 mm. The wind shielding plate 20*a* was provided on the YZ plane.

Example 3

The length (length in the X direction) of the second wind flow region 22 was 191 mm. Example 3 was the same as Example 1 except that the length (length in the X direction) of the second wind flow region 22 was changed.

Example 4

The length (length in the X direction) of the second wind flow region 22 was 205 mm. Example 4 was the same as Example 1 except that the length (length in the X direction) of the second wind flow region 22 was changed.

Example 5

The length (length in the X direction) of the second wind flow region 22 was 255 mm. Example 4 was the same as Example 1 except that the length (length in the X direction) of the second wind flow region 22 was changed.

Comparative Example 2

Figure 8:
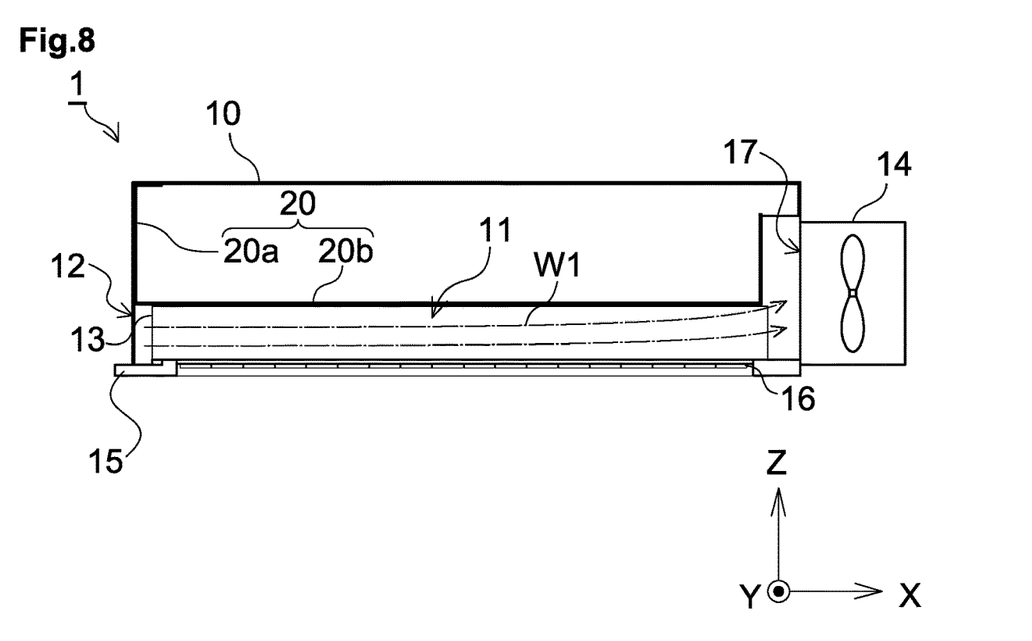
FIG. 8 is a schematic cross sectional view of the XZ plane of a light irradiation device of Comparative Example 2.

The length (length in the X direction) of the second wind flow region 22 was 306 mm. FIG. 8 is a schematic cross sectional view of the XZ plane of a light irradiation device 1 of Comparative Example 2. As shown in FIG. 8, the height (length in the Z direction) of the wind flow path 11 is constant throughout its length. The other conditions were the same as those in Example 1.

Simulation Method

The LED elements 16*a* constituting the light source part 16 were turned on while cooling wind W1 was taken in through the air inlet 12 at a wind speed of 7 m/s, and when the LED elements 16*a* reached a steady state, the temperature of the light source part 16 was measured throughout the first surface 15 to calculate a temperature distribution.

Result

Figure 9:
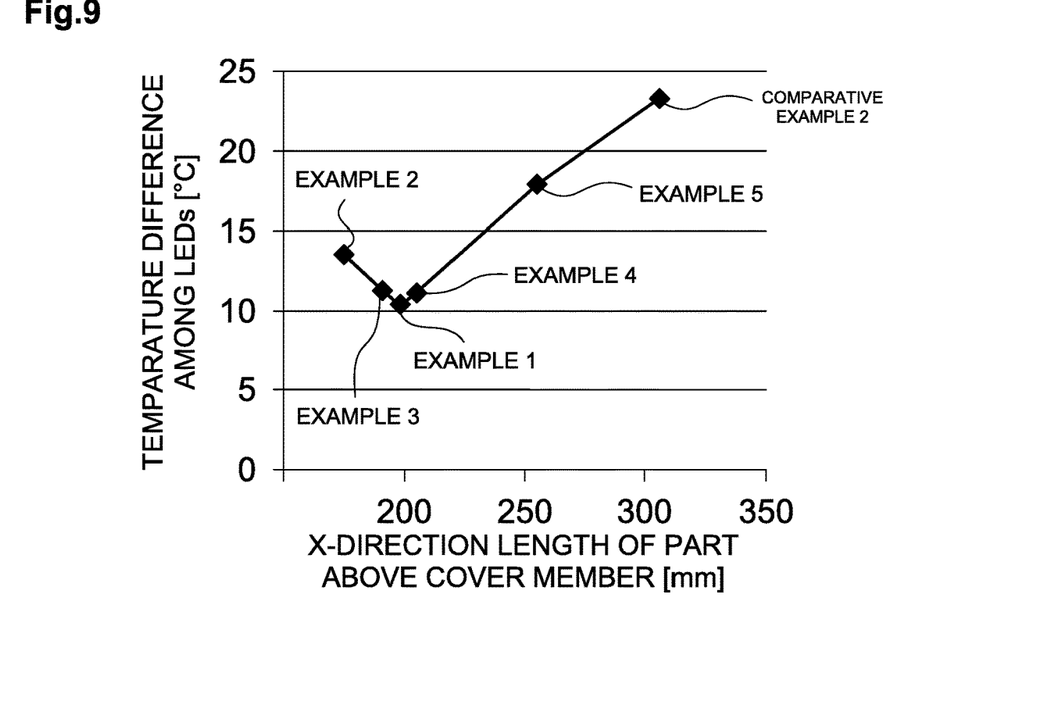
FIG. 9 is a graph showing the simulation result of Examination 2.

FIG. 9 is a graph showing the simulation result of Examination 2. As can be seen from FIG. 9, the temperature difference in the entire light source part 16 was smaller in all the Examples 2 to 5 than in the conventional structure (Comparative Example 2). Further, the temperature difference gradually decreases as the length (length in the X direction) of the second wind flow region 22 decreases, however, on the other hand, when the length (length in the X direction) of the second wind flow region 22 is 175 mm (Example 2) or 191 mm (Example 3) which is smaller than 198 mm (Example 1), the temperature difference is larger.

At present, the present inventors presume that the cause of the fact that the temperature differences in Example 2 and Example 3 were larger than the temperature difference in Example 1 is as follows. When the length (length in the X direction) of the first wind flow region 21 where the flow rate does not increase is large as in Examples 2 and 3, a region where heat rejection efficiency is reduced is created in part of the heat sink 13.

Further, the velocity of the cooling wind W1 is higher throughout the wind flow path 11 in a structure in which the heat sink 13 is entirely covered with the cover member 20*b*, such as Comparative Example 2 shown in FIG. 8 than in a structure in which the cover member 20*b* is not provided. However, as shown in FIG. 9, the temperature difference in the entire light source part 16 is not improved even when the velocity is increased throughout the wind flow path 11.

The optimum length (length in the X direction) of the second wind flow region 22 varies depending on, for example, the size or shape of the wind flow path 11, however, under the conditions of this examination, when the length (length in the X direction) of the second wind flow region 22 is 198 mm (Example 3) longer than 153 mm that is half the length of the wind flow path 11, the temperature difference in the entire light source part 16 is smallest. Based on the above-described reason, this fact reveals that the length (length in the X direction) of the second wind flow region 22 is preferably longer than the length (length in the X direction) of the first wind flow region 21.

Another Embodiment

Hereinbelow, another embodiment will be described.

Figure 10:
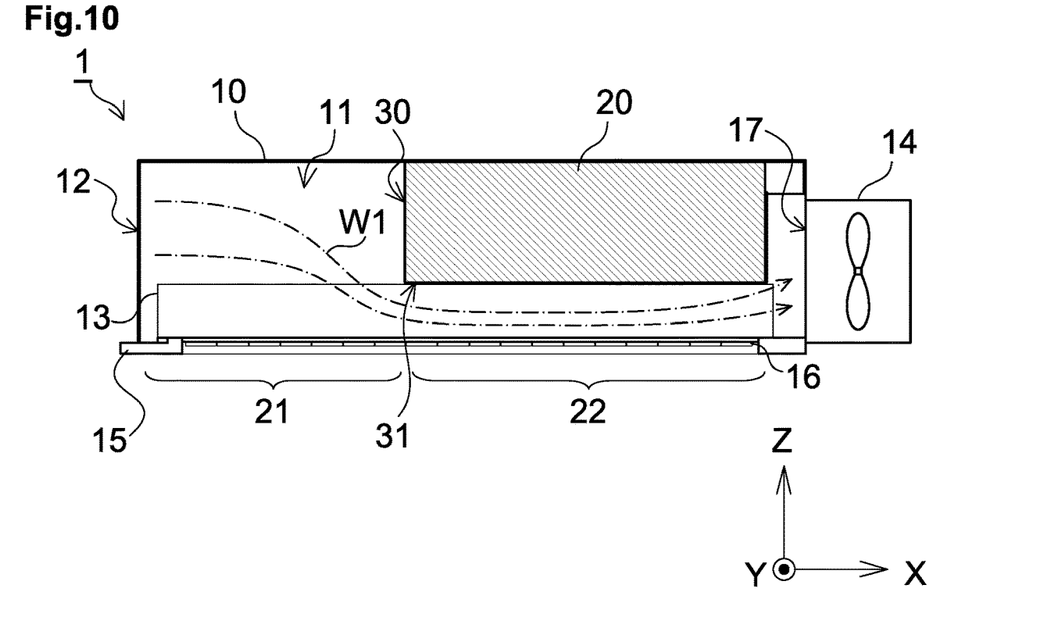
FIG. 10 is a schematic sectional view of the XZ plane of another embodiment of the light irradiation device.

<1> FIG. 10 is a schematic sectional view of the XZ plane of another embodiment of the light irradiation device 1. As shown in FIG. 10, the wind shielding member 20 may not be one constituted from the wind shielding plate 20*a* and the cover member 20*b*. FIG. 10 shows, as an example, a rectangular parallelepiped wind shielding member 20 having a wind shielding surface 30 and a wind guiding surface 31. The wind shielding surface 30 shields part of cooling wind W1 travelling in the +X direction, and the wind guiding surface 31 is provided to make the height of the wind flow path 11 from the first surface 15 lower than the height of the first wind flow region 21.

It is to be noted that in this case, the wind shielding member 20 may be hollow. When the wind shielding member 20 shown in FIG. 10 is hollow, the entire size of the light irradiation device 1 can be reduced by placing the power source etc. of the blower 14 inside the wind shielding member 20.

Figure 11:
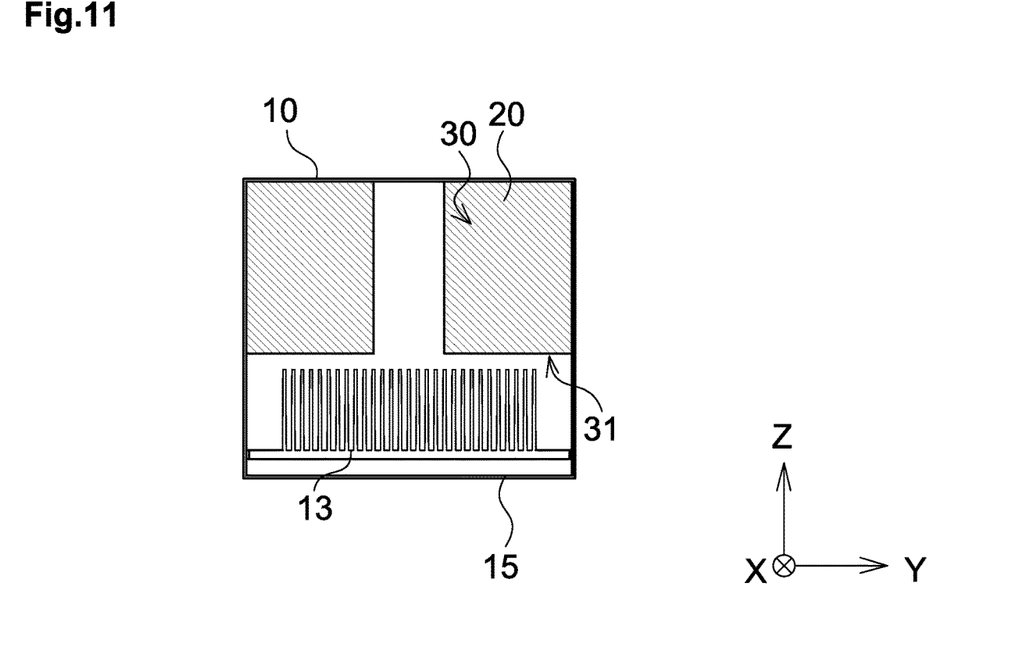
FIG. 11 is a schematic sectional view of the YZ plane of another embodiment of the light irradiation device.

<2> FIG. 11 is a schematic sectional view of the YZ plane of another embodiment of the light irradiation device 1. As shown in FIG. 11, the light irradiation device 1 according to this embodiment includes two wind shielding members 20 provided in the housing 10. In this way, a plurality of wind shielding members 20 may be provided.

Figure 12:
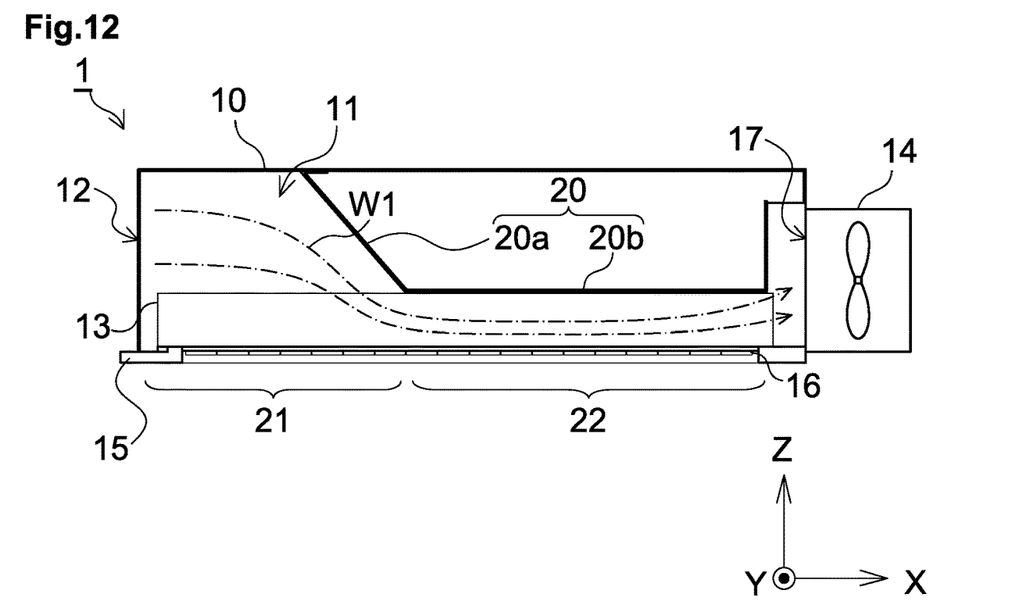
FIG. 12 is a schematic sectional view of the XZ plane of another embodiment of the light irradiation device.

<3> FIG. 12 is a schematic sectional view of the XZ plane of another embodiment of the light irradiation device 1. As shown in FIG. 12, the first wind flow region 21 may be configured so that the height thereof from the first surface 15 gradually decreases toward the second wind flow region 22, that is, the first wind flow region 21 has a region that gradually becomes small toward the second wind flow region 22.

<4> In each of the embodiments, the wind flow path 11 having a rectangular parallelepiped shape is shown as an example to explain a reduction in the flow path sectional area, but the wind flow path 11 may be configured so that part of air flowing in the wind flow path 11 flows in a direction different from the direction from the air inlet 12 to the air outlet 17.

<5> The above-described structures are merely examples of the structure of the light irradiation device 1, and the present invention is not limited to these structures shown in the drawings.

What is claimed is:

1. A light irradiation device comprising:
   a housing;
   an air inlet through which cooling wind for cooling is introduced into the housing;
   an air outlet through which the cooling wind is discharged to outside of the housing;
   a wind flow path through which the cooling wind taken in through the air inlet into the housing flows toward the air outlet;
   a light source part configured to be able to emit light toward the outside of the housing via a first surface that is one side surface of the housing, the light source part including a plurality of LED elements arranged along the first surface in a region of the housing located on a first surface side of the housing; and
   a heat sink provided at a position opposite to the first surface based on the light source part, in the wind flow path,
   wherein the wind flow path includes;
      a first wind flow region, and
      a second wind flow region located closer to the air outlet than the first wind flow region and having a smaller flow path cross sectional area than the first wind flow region; and
   the heat sink is provided across the first wind flow region and the second wind flow region.

2. The light irradiation device according to claim 1, wherein the second wind flow region is configured so that a length thereof in a direction from the air inlet to the air outlet is larger than that of the first wind flow region.

3. The light irradiation device according to claim 2, further comprising a wind shielding member provided in the wind flow path and having at least two surfaces,
   the wind shielding member including
      a wind shielding surface that shields part of the cooling wind that has flowed through the first wind flow region toward the second wind flow region, and
      a wind guiding surface connected to the wind shielding surface, extending along the first surface, and located closer to the air outlet than the wind shielding surface in a direction in which the wind shielding surface extends,
   wherein the second wind flow region is a region closer to the first surface than the wind guiding surface, and
   the first wind flow region is longer than the second wind flow region in a direction orthogonal to the first surface.

4. The light irradiation device according to claim 2, wherein the first wind flow region is configured to have a region whose flow path cross sectional area gradually decreases as getting close to the second wind flow region.

5. The light irradiation device according to claim 2, wherein the housing includes, in a side surface having the air outlet, a blower for discharging the cooling wind to the outside of the housing.

6. The light irradiation device according to claim 1, further comprising a wind shielding member provided in the wind flow path and having at least two surfaces,
   the wind shielding member including
      a wind shielding surface that shields part of the cooling wind that has flowed through the first wind flow region toward the second wind flow region, and
      a wind guiding surface connected to the wind shielding surface, extending along the first surface, and located closer to the air outlet than the wind shielding surface in a direction in which the wind shielding surface extends,
   wherein the second wind flow region is a region closer to the first surface than the wind guiding surface, and
   the first wind flow region is longer than the second wind flow region in a direction orthogonal to the first surface.

7. The light irradiation device according to claim 6, wherein the first wind flow region is configured to have a region whose flow path cross sectional area gradually decreases as getting close to the second wind flow region.

8. The light irradiation device according to claim 6, wherein the housing includes, in a side surface having the air outlet, a blower for discharging the cooling wind to the outside of the housing.

9. The light irradiation device according to claim 1, wherein the first wind flow region is configured to have a region whose flow path cross sectional area gradually decreases as getting close to the second wind flow region.

10. The light irradiation device according to claim 9, wherein the housing includes, in a side surface having the air outlet, a blower for discharging the cooling wind to the outside of the housing.

11. The light irradiation device according to claim 1, wherein the housing includes, in a side surface having the air outlet, a blower for discharging the cooling wind to the outside of the housing.

* * * * *